(12) United States Patent
Pi et al.

(10) Patent No.: US 10,587,274 B2
(45) Date of Patent: Mar. 10, 2020

(54) METHOD AND SYSTEM FOR MAINTAINING A LOW-JITTER LOW-TEMPERATURE-DRIFT CLOCK DURING A HOLDOVER OPERATION

(71) Applicant: NewCoSemi (Beijing) Technology Co., Ltd, Beijing (CN)

(72) Inventors: Deyi Pi, Beijing (CN); Chang Liu, Beijing (CN); Jinliang Liu, Beijing (CN)

(*) Notice: Subject to any disclaimer, the term of this patent is extended or adjusted under 35 U.S.C. 154(b) by 0 days.

(21) Appl. No.: 15/818,506

(22) Filed: Nov. 20, 2017

(65) Prior Publication Data
US 2020/0044657 A1   Feb. 6, 2020

(30) Foreign Application Priority Data
Nov. 10, 2017  (CN) .......................... 2017 1 1108021

(51) Int. Cl.
| H03L 7/06 | (2006.01) |
| H03L 7/099 | (2006.01) |
| H03L 7/089 | (2006.01) |
| H03L 7/087 | (2006.01) |

(52) U.S. Cl.
CPC ............ H03L 7/0992 (2013.01); H03L 7/087 (2013.01); H03L 7/0891 (2013.01); *H03L 2207/06* (2013.01)

(58) Field of Classification Search
CPC ....... H03L 7/07; H03L 7/089; H03L 2207/50; H03L 7/087; H03L 7/0992
USPC ................................ 375/371, 373, 375, 376
See application file for complete search history.

(56) References Cited

U.S. PATENT DOCUMENTS

| 8,791,734 | B1* | 7/2014 | Hara ....................... H03L 7/146 327/156 |
| 2012/0280735 | A1* | 11/2012 | Zhang ..................... H03L 7/146 327/184 |
| 2017/0194971 | A1* | 7/2017 | Yonezawa ............... H03L 7/095 |
| 2017/0310330 | A1* | 10/2017 | Nakajima ............... H03L 1/022 |
| 2018/0262324 | A1* | 9/2018 | Creasy .................. H04L 5/0048 |

* cited by examiner

*Primary Examiner* — Emmanuel Bayard

(57) ABSTRACT

Various embodiments a PLL-based clock unit is disclosed. An exemplary clock unit includes a PLL, a low-jitter XO to provide a low-jitter input clock and a low-cost TCXO to provide a low-temperature-drift clock. The clock unit additionally includes a holdover module coupled to the PLL and configured to receive the low-jitter input clock and a reference input clock; record a relationship between the low-jitter input clock and the reference input clock during a normal operation mode; and output the recorded relationship to the PLL as a control signal during a holdover operation mode when the reference input clock is unavailable. This clock unit additionally includes a statistical module to compute a relationship between the low-jitter input clock and the low-temperature-drift clock; and a control module to dynamically adjust the output of the holdover module based on the determined relationship so that the output clock of the clock unit maintains both low-jitter and low-temperature-drift characteristics.

20 Claims, 10 Drawing Sheets

CLOCK UNIT 500

METHOD AND SYSTEM FOR MAINTAINING A LOW-JITTER LOW-TEMPERATURE-DRIFT CLOCK DURING A HOLDOVER OPERATION

TECHNICAL FIELD

The present disclosure generally relates to the field of clock synthesis for communication systems, and more specifically to systems and techniques for maintaining a low-jitter, low-temperature-drift clock signal during a holdover operation mode of a communication system.

BACKGROUND

A great number of modern communication systems, whether wired-based or wireless-based, are time-synchronized systems. In a time-synchronized communication system, one or more reference clocks are delivered from one or more clock sources to various devices in the system through a network. To increase the operation stabilities of the various devices in the communication system while also improving the flexibilities of these devices for different applications, there are generally more than one reference clock which are provided to these devices. However, in the event when the clock unit in a given device switches from one reference input clock to another reference input clock or when one or more of the reference input clocks fail, to ensure that the output of the clock unit maintains performance and clock stabilities, it is generally required that the clock unit include a "holdover" function and a holdover module to establish a stable output clock during such circumstances.

More specifically, in the communication systems, the holdover module is designed to perform the holdover function, i.e., to keep the output clock of the clock unit within a small error margin when the reference input clock is being switched, lost, or malfunctions, thereby ensuring the frequency stability of the output clock even when the reference input clock is being switched, lost, or malfunctions. The existing holdover modules are generally used in conjunction with a phase-locked loop (PLL). More specifically, a holdover module is typically configured to record the reference input clock or the state of the entire PLL when the reference input clock is stable. When the reference input clock is being switched, lost, or malfunctions, the holdover module is configured to apply the recorded reference input clock or the state of the entire PLL to an input of the PLL or to another point within the loop of the PLL to ensure that the output clock frequency remains stable.

However, existing implementations of the holdover function in a clock circuit/unit/module generally do not provide a satisfactory solution to both resolve the issue of frequency drift which might be caused by ambient temperature changes and at the same time maintain low jitter in the output clock. Hence, there is a need for a more effective holdover system and technique for these communication systems.

SUMMARY

This patent document provides various embodiments of a clock generation system and technique for maintaining a low-jitter, low-temperature-drift output clock signal within a communication system during a holdover operation mode of the communication system. Some existing clock generation systems and techniques maintain a low-temperature-drift output clock during a holdover mode of operation by using either an oven-controlled crystal oscillator (OCXO) with a constant-temperature characteristics or a temperature-compensate crystal oscillator (TCXO) with temperature-compensation properties. However, existing TCXOs typically cannot maintain a low-jitter output clock signal. To mediate this drawback, some existing systems use differential TCXOs to provide the additional low-jitter output clock characteristics. However, using such differential TCXOs or OCXOs to achieve the required low-jitter output clock characteristic significantly increases the overall system cost.

Described herein are various embodiments of a clock generation circuit/unit/module/system (generally referred to as a "clock unit" hereinafter) and clock generation technique for generating a low-jitter, low-temperature-drift clock signal for various components within a communication system during a holdover mode of operation of the communication system. In various examples, a proposal clock unit includes both a low-jitter XO to provide a low-jitter clock source and a low-cost ordinary TCXO to provide a low-temperature-drift clock source. By using both the low-jitter clock source and the low-temperature-drift clock source as inputs, the clock unit can continue to generate a low-jitter and low-temperature-drift output clock after the communication system enters the holdover operation mode (i.e., when the main reference input clock is unavailable and the PLL uses a holdover module to replace the main reference input clock). Moreover, because both the low-jitter XO and the ordinary TCXO are low-cost components, the proposed clock unit does not significantly increase the overall system cost. In some other embodiments of the proposal clock unit, the low-jitter XO can be implemented with a crystal as the main body in conjunction with a low-jitter oscillation circuit. Therefore, the proposal clock unit is not limited to using a low-jitter XO to provide the low-jitter clock source.

In some embodiments, to generate the low-jitter and low-temperature-drift output clock based on the low-jitter clock source and the low-temperature-drift clock source during the holdover operation mode, the proposal clock unit additionally includes two processing modules: a statistical module configured to compute a relationship between the low-jitter XO output frequency and the ordinary TCXO output frequency; and a control module configured to dynamically adjust the output of the holdover module based on the determined relationship from the statistical module so that the output clock of the proposed clock unit maintains both low-jitter and low-temperature-drift characteristics.

In some embodiments, the proposed clock unit does not use the ordinary TCXO and the statistical module to determine the frequency drift of the low-jitter clock source. Instead, the proposed clock unit uses a known relationship between the frequency change of the low-jitter input clock and the temperature change and a thermal sensor to measure real-time temperature change. The clock unit then directly determines an amount of frequency drift in the low-jitter input clock in real time, and subsequently uses the determined frequency drift to dynamically adjust a control signal from the holdover module which is used to control the PLL operation during the holdover operation mode.

In one aspect, a phase-locked loop (PLL)-based clock generation module is disclosed. This clock generation module includes: a PLL configured to receive a reference input clock, to generate an output clock based on the reference input clock during a first operation mode, and to receive a low-jitter input clock during the first operation mode; a holdover module coupled to the PLL and configured to: receive the low-jitter input clock and the reference input clock; record a first relationship between the frequency of the low-jitter input clock and the frequency of the reference input clock during the first operation mode; and output the recorded first relationship to the PLL as a control signal to control the operation of the PLL during a second operation mode when the reference input clock is not available. This clock generation module further includes a control module coupled to the holdover module and configured to: receive a second relationship between a frequency change of the low-jitter input clock and a temperature change; and dynamically adjust the output of the holdover module during the second operation mode based on the second relationship to compensate for a frequency drift in the low-jitter input clock caused by the temperature change. During the second operation mode, the PLL is further configured to: receive the low-jitter input clock; receive the control signal from the holdover module, wherein the control signal includes the recorded first relationship dynamically adjusted based on the second relationship; and generate an output clock based on the low-jitter input clock and the control signal, wherein the output clock has both low-jitter and low-temperature-drift characteristics.

In some implementations, the clock generation module further comprises a low-jitter clock source. The low-jitter clock source is coupled to an input of the PLL and configured to generate the low-jitter input clock.

In some implementations, the low-jitter clock source includes a low-jitter crystal oscillator (XO).

In some implementations, the low-jitter clock source includes a crystal as the main body and a low-jitter oscillation circuit coupled to the crystal.

In some implementations, the low-jitter input clock is received from an external clock source.

In some implementations, the reference input clock is received from an external clock source.

In some implementations, the first relationship includes a first ratio of the reference input clock to the low-jitter input clock, wherein the first ratio is a time-variant function.

In some implementations, the holdover module is further configured to store the first relationship during the first operation mode.

In some implementations, the clock generation module is switched from the first operation mode to the second operation mode when the reference input clock is switched from one external clock source to another external clock source, is lost or malfunctions.

In some implementations, the clock generation module further includes a low-cost temperature-compensate crystal oscillator (TCXO) configured to generate a low-temperature-drift input clock.

In some implementations, the clock generation module further includes a statistical module coupled to the control module, wherein the statistical module is configured to: receive the low-jitter input clock from the low-jitter clock source and the low-temperature-drift input clock from the low-cost TCXO; compute the second relationship based on the low-jitter input clock and the low-temperature-drift input clock; and provide the computed second relationship to the control module.

In some implementations, the second relationship includes a second ratio of the low-jitter input clock to the low-temperature-drift input clock, wherein the second ratio is a time-variant function.

In some implementations, the control module is configured to dynamically adjust the output of the holdover module during the second operation mode based on the second relationship by: determining if the second ratio increases in value from the previous sampling time; and if so, dynamically adjusting the output of the holdover module by decreasing the output value to offset the increase in value of the second ratio, thereby compensating for an upward frequency drift of the low-jitter input clock as a result of the temperature change.

In some implementations, the control module is configured to dynamically adjust the output of the holdover module during the second operation mode based on the second relationship by: determining if the second ratio decreases in value from the previous sampling time; and if so, dynamically adjusting the output of the holdover module by increasing the output value to offset the decrease in value of the second ratio, thereby compensating for a downward frequency drift of the low-jitter input clock as a result of the temperature change.

In some implementations, the output clock and the PLL are in a phase and frequency locked operation during the second operation mode even without the reference input clock.

In some implementations, both the low-jitter XO and the low-cost TCXO are low-cost devices, thereby ensuring that the output clock has both low-jitter and low-temperature-drift characteristics while the clock generation module still has a low overall system cost.

In some implementations, the clock generation module further includes a thermal sensor and an analog-to-digital converter (ADC) coupled to output of the thermal sensor, wherein the thermal sensor and the ADC are configured to measure a temperature change at a given time during the second operation mode.

In some implementations, the second relationship includes a known relationship between the frequency change of the low-jitter input clock and the temperature change, and the control module is configured to dynamically adjust the output of the holdover module during the second operation mode based on the second relationship by: receiving the known relationship between the frequency change of the low-jitter input clock and the temperature change; receiving the measured temperature change at the given time; determining an amount of frequency drift of the low-jitter input clock at the given time based on the known relationship and the measured temperature change at the given time; and dynamically adjusting the output of the holdover module to compensate for the amount of frequency drift of the low-jitter input clock determined at the given time, thereby maintaining a low-jitter and low-temperature-drift output clock.

In some implementations, the low-jitter XO is a low-cost device, and both the thermal sensor and the ADC are implemented inside a chip, thereby ensuring that the output clock has both low-jitter and low-temperature-drift characteristics while the clock generation module still has a low overall system cost.

In another aspect, a PLL module is disclosed. This PLL module includes a phase comparator (PD), a low pass filter (LPF), and a voltage-controlled oscillator (VCO) coupled together in a loop circuit, wherein the PLL module is configured to receive a reference input clock and generate an output clock based on the reference input clock during a first operation mode. This PLL module further includes a holdover module coupled to the loop circuit and configured to: receive a low-jitter input clock from a low-jitter clock source and the reference input clock; record a first relationship between the frequency of the low-jitter input clock and the frequency of the reference input clock during the first operation mode; and output the recorded first relationship to the loop circuit as a control signal to control the operation of the loop circuit during a second operation mode when the reference input clock is not available. The PLL module additionally includes a control module coupled to the holdover module and configured to: receive a second relationship between a frequency change of the low-jitter input clock and a temperature change; and dynamically adjust the output of the holdover module during the second operation mode based on the second relationship to compensate for a frequency drift in the low-jitter input clock caused by the temperature change. During the second operation mode, the loop circuit is further configured to: receive the low-jitter input clock; receive the control signal from the holdover module, wherein the control signal includes the recorded first relationship dynamically adjusted based on the second relationship; and generate an output clock based on the low-jitter input clock and the control signal, wherein the output clock has both low-jitter and low-temperature-drift characteristics.

In some implementations, the PLL module further includes a statistical module coupled to the control module, wherein the statistical module is configured to: receive the low-jitter input clock from the low-jitter clock source; receive a low-temperature-drift input clock from the low-cost TCXO; compute the second relationship based on the low-jitter input clock and the low-temperature-drift input clock; and provide the computed second relationship to the control module.

In yet another aspect, a technique for performing a holdover function within a clock module based on a PLL is disclosed. The technique includes the steps of: receiving a low-jitter input clock from a low-jitter clock source; receiving a reference input clock from an external clock source; recording a first relationship between the frequency of the low-jitter input clock and the frequency of the reference input clock during a first operation mode of the PLL when the reference input clock is available; determining a second relationship between a frequency change of the low-jitter input clock and a temperature change; outputting the recorded first relationship as a control signal to control the operation of the PLL during a second operation mode of the PLL when the reference input clock is not available, wherein the second operation mode of the PLL includes generating an output clock based on the low-jitter input clock and the control signal; and while controlling the operation of the PLL based on the recorded first relationship, dynamically adjusting the recorded first relationship based on the second relationship to compensate for a frequency drift in the low-jitter input clock caused by the temperature change so that the output clock has both low-jitter and low-temperature-drift characteristics.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Features of the subject technology are set forth in the appended claims. However, for purpose of explanation, several embodiments of the subject technology are set forth in the following figures.

DETAILED DESCRIPTION

Figure 1:
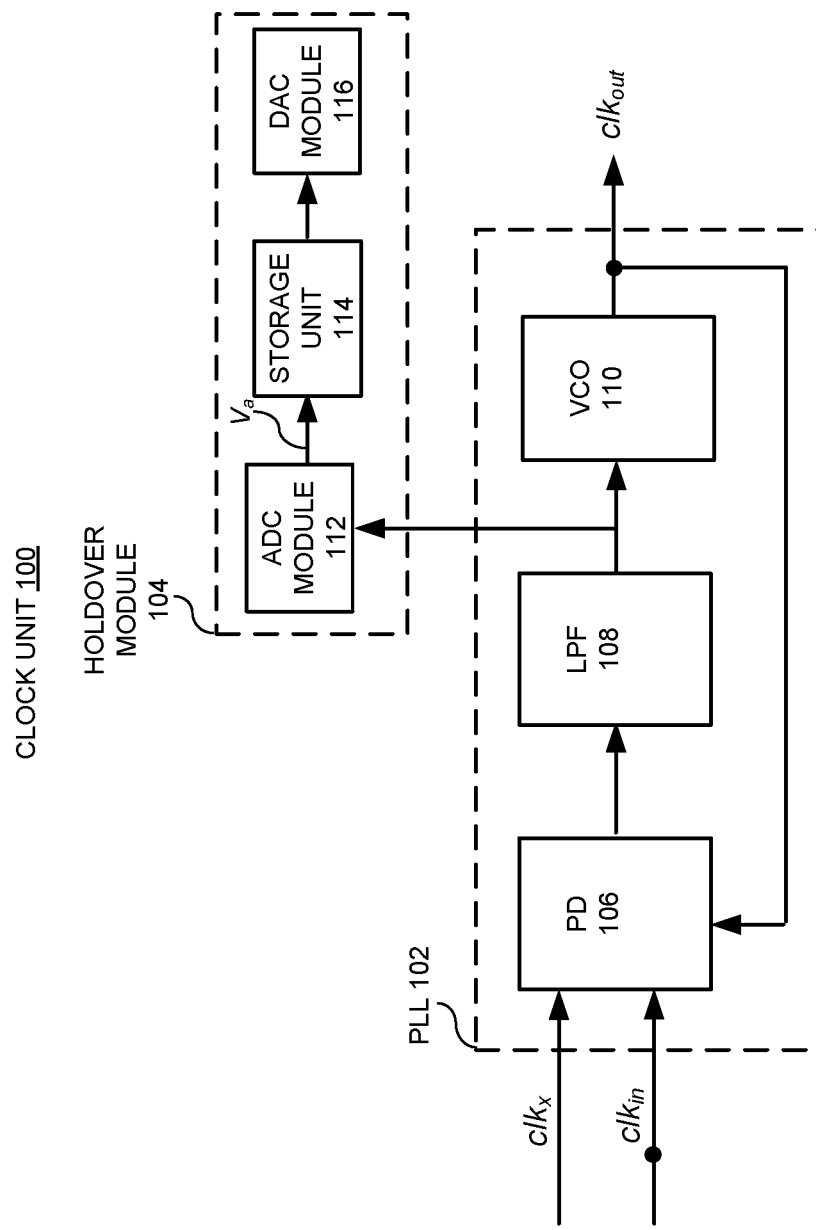
FIG. 1 illustrates a schematic diagram of an exemplary clock unit including both a phase-locked loop (PLL) and a holdover module during a normal operation mode.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without these specific details. In some instances, structures and components are shown in block diagram form in order to avoid obscuring the concepts of the subject technology.

Existing clock generation systems and techniques maintain a low-temperature-drift output clock during a holdover mode of operation by using either an oven-controlled crystal oscillator (OCXO) with a constant-temperature characteristics or a temperature-compensate crystal oscillator (TCXO) with temperature-compensation properties. However, existing TCXOs typically cannot maintain a low-jitter output clock signal. To mediate this drawback, some existing systems use differential TCXOs to provide the additional low-jitter output clock characteristics. However, using such differential TCXOs or OCXOs to achieve the required low-jitter output clock characteristic significantly increases the overall system cost.

Described herein are various embodiments of a clock generation circuit/unit/module/system (generally referred to as a "clock unit" hereinafter) and clock generation technique for generating a low-jitter, low-temperature-drift clock signal for various components within a communication system during a holdover mode of operation of the communication system. In various examples, a proposal clock unit includes both a low-jitter XO to provide a low-jitter clock source and a low-cost ordinary TCXO to provide a low-temperature-drift clock source. By using both the low-jitter clock source and the low-temperature-drift clock source as inputs, the clock unit can continue to generate a low-jitter and low-temperature-drift output clock after the communication system enters the holdover operation mode (i.e., when the main reference input clock is unavailable and the PLL uses a holdover module to replace the main reference input clock). Moreover, because both the low-jitter XO and the ordinary TCXO are low-cost components, the proposed clock unit does not significantly increase the overall system cost. In some other embodiments of the proposal clock unit, the low-jitter XO can be implemented with a crystal as the main body in conjunction with a low-jitter oscillation circuit. Therefore, the proposal clock unit is not limited to using a low-jitter XO to provide the low-jitter clock source.

In some embodiments, to generate the low-jitter and low-temperature-drift output clock based on the low-jitter clock source and the low-temperature-drift clock source during the holdover operation mode, the proposal clock unit additionally includes two processing modules: a statistical module configured to compute a relationship between the low-jitter XO output frequency and the ordinary TCXO output frequency; and a control module configured to dynamically adjust the output of the holdover module based on the determined relationship from the statistical module so that the output clock of the proposed clock unit maintains both low-jitter and low-temperature-drift characteristics.

In some embodiments, the proposed clock unit does not use the ordinary TCXO and the statistical module to determine the frequency drift of the low-jitter clock source. Instead, the proposed clock unit uses a known relationship between the frequency change of the low-jitter input clock and the temperature change, and a thermal sensor to measure real-time temperature change. The clock unit then directly determines an amount of frequency drift in the low-jitter input clock in real time, and subsequently uses the determined frequency drift to dynamically adjust a control signal from the holdover module which is used to control the PLL operation during the holdover operation mode.

FIG. 1 illustrates a schematic diagram of an exemplary clock unit 100 including both a phase-locked loop (PLL) 102 and a holdover module 104 during a normal operation mode. As can be seen in FIG. 1, clock unit 100 receives both a low-jitter input clock $clk_x$ from a low-jitter XO (not shown) and a reference input clock $clk_{in}$ from an external clock source (also not shown). PLL 102 includes a phase comparator (PD) 106, a low pass filter (LPF) 108, and a voltage-controlled oscillator (VCO) 110. PLL 102 receives low-jitter input clock $clk_x$ and reference input clock $clk_{in}$ at the same time, and generates an output clock $clk_{out}$ from an output of VCO 110. Note that other implementations of PLL 102 may have greater or fewer components than the one shown in FIG. 1 without departing for the scopes of the present disclosure.

As shown in FIG. 1, during the normal operation mode of PLL 102, holdover module 104 is configured to store the value of a control voltage for controlling VCO 110. More specifically, holdover module 104 further includes an analog-to-digital converter (ADC) module 112, a storage unit 114, and a digital-to-analog converter (DAC) module 116. The control voltage value formed after LPF 108 is converted by ADC module 112 to obtain a digital value $V_a$ which is the control voltage for VCO 110. As can be seen in FIG. 1, the digital value $V_a$ is then stored in storage unit 114.

Figure 2:
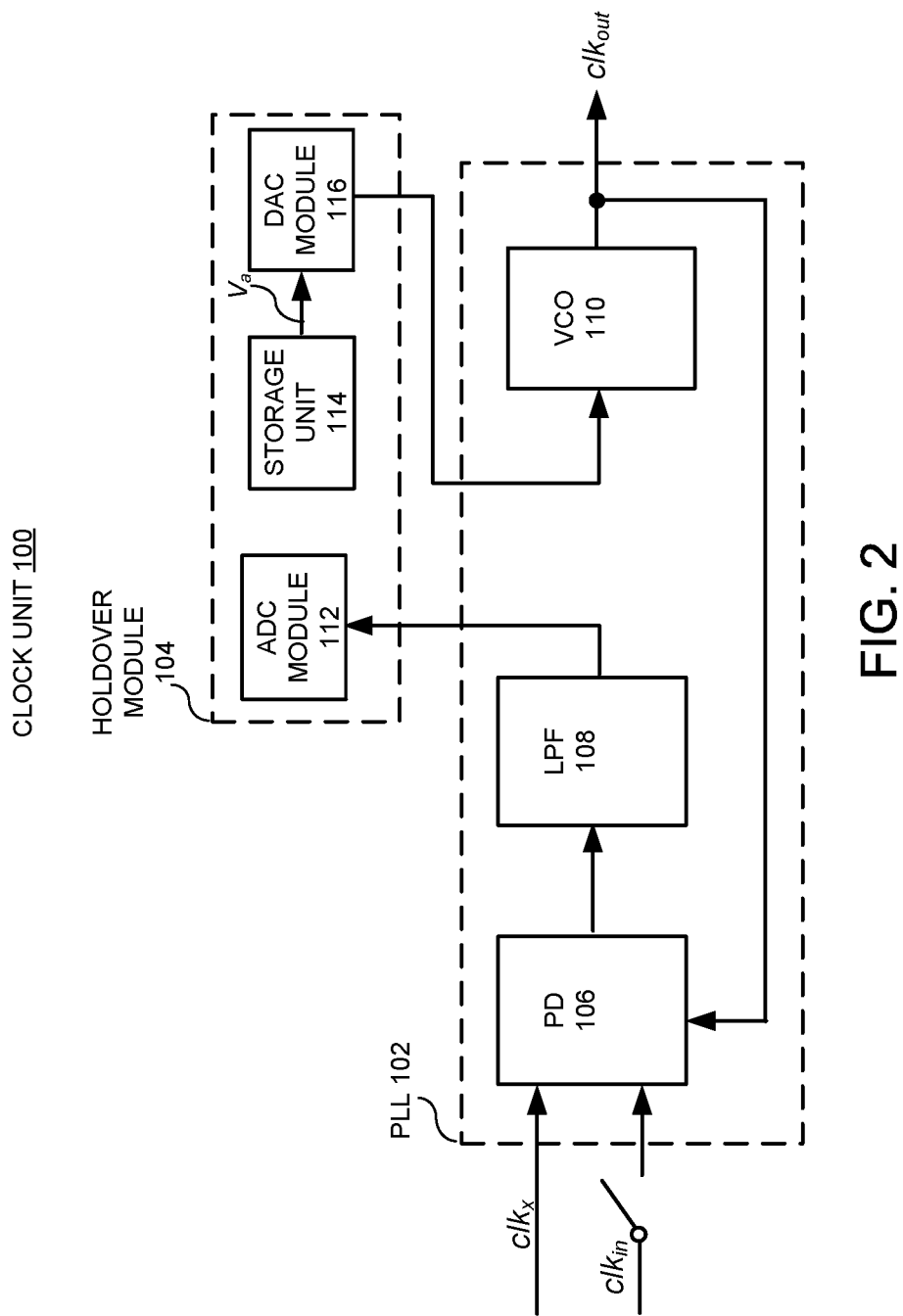
FIG. 2 illustrates a schematic diagram of the exemplary clock unit 100 during a holdover operation mode.

FIG. 2 illustrates a schematic diagram of the exemplary clock unit 100 during a holdover operation mode. As can be seen in FIG. 2, when the reference input clock $clk_{in}$ is switched, lost, or malfunctions (represented in FIG. 2 as an open circuit in the $clk_{in}$ clock path), holdover module 104 is configured to use DAC module 116 to process the stored control voltage $V_a$ to obtain a corresponding analog control signal. This analog control signal is then coupled into the control input of VCO 110 to replace the voltage control input received directly from the output of LPF 108 (illustrated in FIG. 2 as missing the direct coupling between LPF 108 and VCO 110 in FIG. 1). Note that using the stored control voltage $V_a$ to control VCO 110 when the reference input clock $clk_{in}$ is lost ensures that the VCO 110 continues to generate output clock $clk_{out}$ having a very small frequency variation, thereby the output of clock unit 100 remains stable. In other words, the holdover technique illustrated in FIG. 2 keeps the output clock $clk_{out}$ stable based on using the stored control voltage $V_a$ recorded during the normal operation mode of clock unit 100.

Note that the frequency precision of the above-described holdover technique is limited by the storage precision (e.g., storage unit 114) of the VCO control voltage, and therefore the frequency stability after entering the holdover operation mode is also limited. Moreover, this technology disconnects the regular PLL loop. As a result, when the supply voltage or the ambient temperature changes, the resulting frequency change in the output clock $clk_{out}$ cannot be compensated, thereby causing frequency shift. In addition, due to the disconnected PLL loop, the phase noise of the output clock $clk_{out}$, i.e., the jitter in the clock signal will also worsen.

Figure 3:
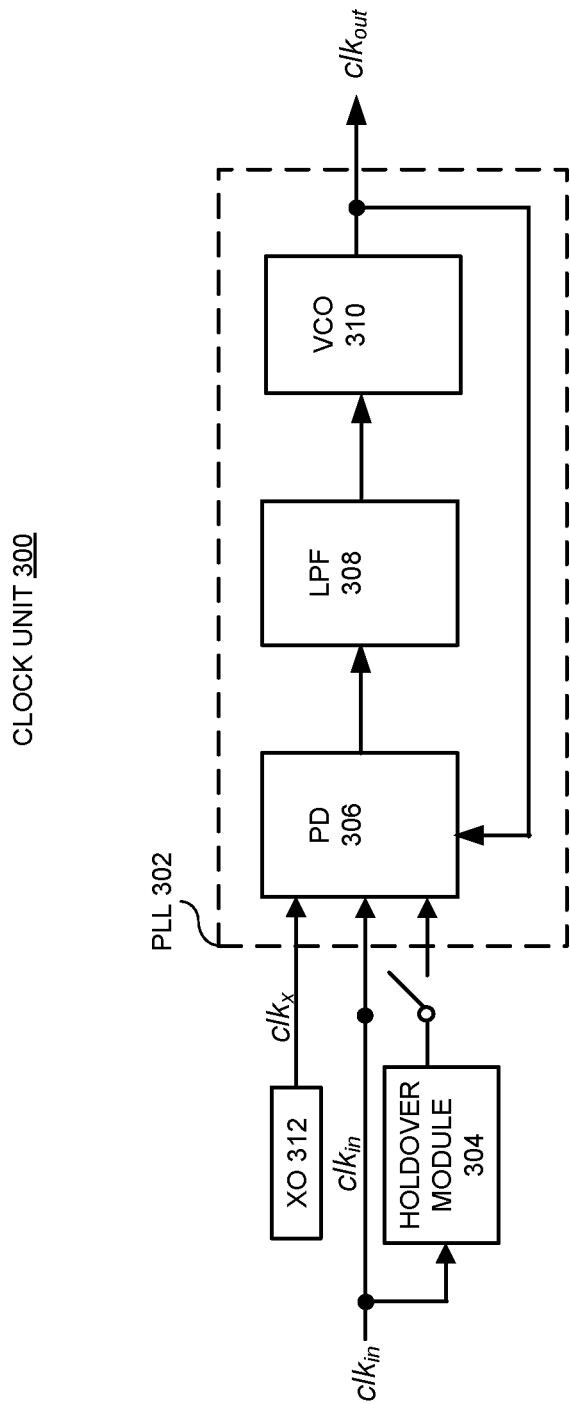
FIG. 3 illustrates a schematic diagram of an exemplary clock unit including both a PLL and a holdover module during a normal operation mode.

FIG. 3 illustrates a schematic diagram of an exemplary clock unit 300 including both a PLL 302 and a holdover module 304 during a normal operation mode. As can be seen in FIG. 3, clock unit 300 receives both a low-jitter input clock $clk_x$ from a low-jitter XO 312 and a reference input clock $clk_{in}$ from an external clock source (not shown). PLL 302 includes a PD 306, a LPF 308, and a VCO 310. PLL 302 receives low-jitter input clock $clk_x$ and reference input clock $clk_{in}$ at the same time, and generates an output clock $clk_{out}$ from an output of VCO 310. In the holdover technique shown in FIG. 3, when the reference input clock $clk_{in}$ is normal, holdover module 304 is configured to record the state of the reference input clock $clk_{in}$. Note that other implementations of PLL 302 may have greater or fewer components than the one shown in FIG. 3 without departing for the scopes of the present disclosure.

Figure 4:
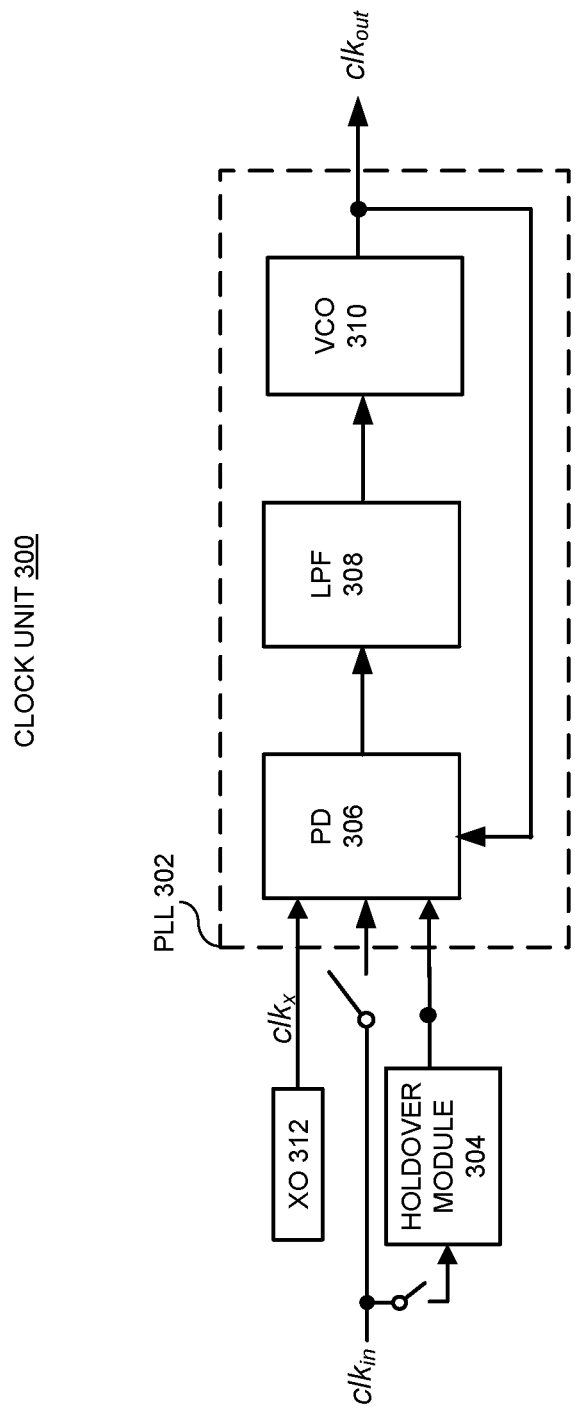
FIG. 4 illustrates a schematic diagram of the exemplary clock unit 300 during a holdover operation mode.

FIG. 4 illustrates a schematic diagram of the exemplary clock unit 300 during a holdover operation mode. As can be seen in FIG. 4, when the reference input clock $clk_{in}$ is switched, lost, or malfunctions (represented in FIG. 4 as open circuits in the $clk_{in}$ clock paths), holdover module 304 is configured to output the state of the reference input clock $clk_{in}$ recorded during the normal operating mode, thereby controlling PLL 302 in place of the reference input clock $clk_{in}$. Note that in the technique shown in FIG. 4, regardless of whether the reference input clock $clk_{in}$ is lost, switched, or malfunctions, the PLL loop remains closed to ensure the stability of the output clock $clk_{out}$.

Unfortunately, the effectiveness of the above technique is limited by the following problem: when the reference input clock is switched, lost, or malfunctions, PLL 302 uses low jitter XO 312 as the reference clock source. However, the output frequency of low jitter XO 312 can change when the ambient temperature changes. On the other hand, the recorded state of the reference input clock $clk_{in}$ by holdover module 304 is fixed, and therefore cannot be used to compensate for such ambient temperature change. Consequently, this holdover technique cannot guarantee any compensation for the temperature drift in the output clock $clk_{out}$ caused by the ambient temperature change. Nevertheless, benefit from the good jitter performance of the low jitter XO 312, the output clock of this technique also possesses a low-jitter characteristic.

Similar to the technique described in conjunction with FIGS. 3 and 4, another existing technique merely replaces low-jitter XO 312 with a temperature-compensate crystal oscillator (TCXO). This technique ensures that, in the situation when the reference input clock is switched, lost, or malfunctions, the frequency stability of the output clock is guaranteed when the ambient temperature changes. However, the drawback of this technique is that the jitter characteristics of the low-cost ordinary TCXO are poor and thus the jitter performance of the output clock is poor. While using differential TCXO or OCXO can additionally ensure better jitter performance, using such XOs can significantly increase the overall system cost.

As can be seen, the above-described techniques all suffer from a common problem. That is, when the reference input clock is switched, lost, or malfunctions, and the clock circuit enters the holdover operation mode, any of the above-described techniques cannot achieve the properties of low system cost, low-jitter, and low-temperature-drift of the output clock all at the same time. More specifically, during the holdover operation mode, output frequency of the low-jitter XO changes with the ambient temperature change; low-cost ordinary TCXO has poor jitter characteristics; and using differential TCXO or OCXO significantly increases system cost.

This patent disclosure provides various embodiments of a clock unit based on using both a low-cost low-jitter XO and a low-cost ordinary TCXO to provide frequency references for generating an output clock $clk_{out}$ during the holdover operation mode, so that the output clock $clk_{out}$ has both the characteristics of low-jitter and low-temperature-drift and at the same time without increasing the overall system cost.

Described herein are various embodiments of a clock generation unit and clock generation technique for generating a low-jitter, low-temperature-drift clock signal for various components within a communication system during a holdover mode of operation of the communication system. In various examples, a proposal clock unit includes both a low-jitter XO to provide a low-jitter clock source and a low-cost ordinary TCXO to provide a low-temperature-drift clock source. By using both the low-jitter clock source and the low-temperature-drift clock source as inputs, the clock unit can continue to generate a low-jitter and low-temperature-drift output clock after the communication system enters the holdover operation mode (i.e., when the main reference input clock is unavailable and the PLL uses a holdover module to replace the main reference input clock). Moreover, because both the low-jitter XO and the ordinary TCXO are low-cost components, the proposed clock unit does not significantly increase the overall system cost.

In some embodiments, to generate the low-jitter and low-temperature-drift output clock based on the low-jitter clock source and the low-temperature-drift clock source during the holdover operation mode, the proposal clock unit additionally includes two processing modules: a statistical module configured to compute a relationship between the low-jitter XO output frequency and the ordinary TCXO output frequency; and a control module configured to dynamically adjust the output of the holdover module based on the determined relationship from the statistical module so that the output clock of the proposed clock unit maintains both low-jitter and low-temperature-drift characteristics.

In a specific implementation of the proposed system and technique, the clock unit has two operation modes: a normal operation mode and a holdover operation mode. The clock unit operates under the normal operation mode when the reference input clock $clk_{in}$ is normal. Under this operation mode, the holdover module is configured to record the state of the reference input clock $clk_{in}$. At the same time, the PLL within the clock unit performs normal locked operations to achieve frequency and phase synchronization in the output clock $clk_{out}$, so that the output clock $clk_{out}$ has both low-jitter and low-temperature-drift characteristics.

The clock unit enters the holdover operation mode when the reference input clock $clk_{in}$ is switched, lost, or malfunctions. Under this operation mode, the holdover module is configured to output the recorded state of the reference input clock $clk_{in}$, and the statistical module is configured to compute the relationship between the low-jitter XO output frequency and the low-cost ordinary TCXO output frequency. The control module is configured to dynamically adjust the output of the holdover module based on the changes in the computed relationship, so as to compensate for the frequency change in the low-jitter input clock from the low-jitter XO caused by the temperature change, thereby ensuring low temperature drift in the output clock during the holdover operation mode. Moreover, during the holdover operation mode, the PLL loop remains closed and the low-jitter input clock from the low-jitter XO is used as the reference clock for the PLL operation. In this manner, the proposed clock unit also ensures low jitter characteristic of the output clock. Furthermore, because both the low-jitter XO and the ordinary TCXO used in the proposed clock unit are low-cost devices, the proposed system and technique also ensures low cost of the entire clock unit.

Figure 5:
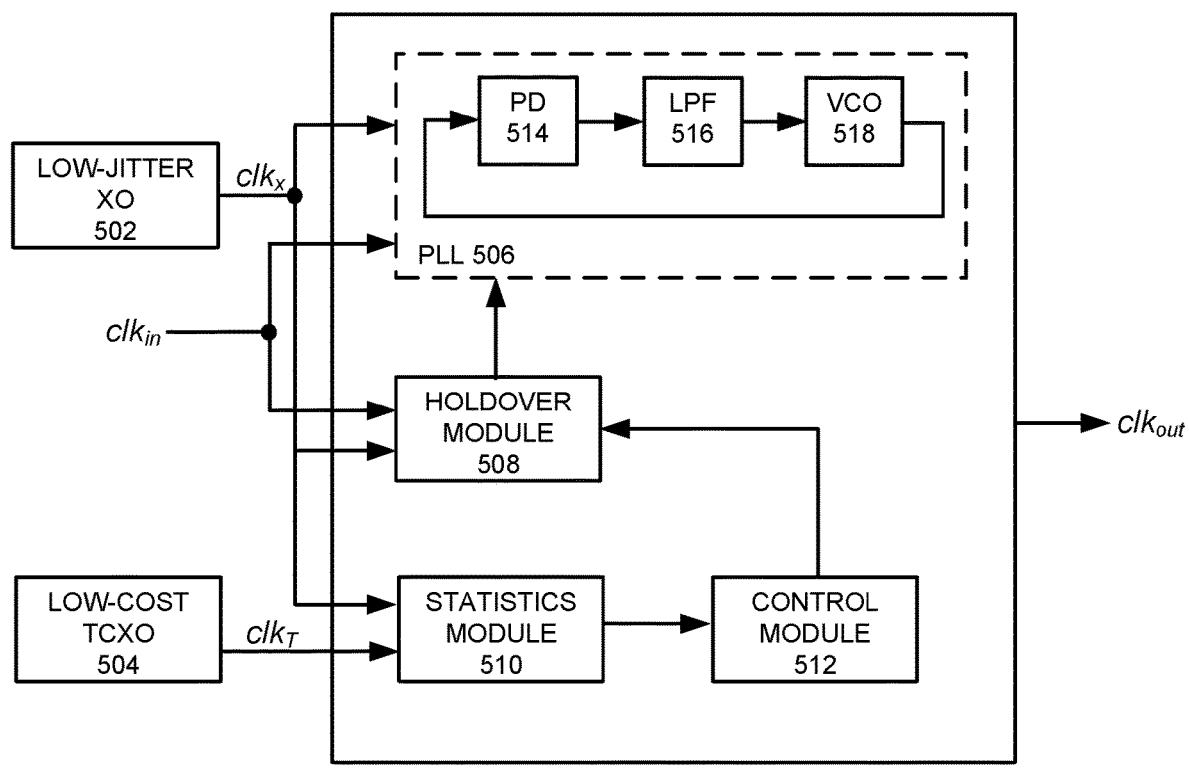
FIG. 5 illustrates a schematic diagram of an exemplary low-cost clock unit for generating a low-jitter, low-temperature-drift clock signal in accordance with some embodiments described herein.

FIG. 5 illustrates a schematic diagram of an exemplary low-cost clock unit 500 for generating a low-jitter, low-temperature-drift clock signal in accordance with some embodiments described herein. As can be seen in FIG. 5, clock unit 500 includes a low-jitter XO 502 for generating a low-jitter input clock $clk_x$, a low-cost ordinary TCXO 504 for generating a low-temperature-drift input clock $clk_T$, a reference input clock $clk_{in}$ from an external clock source, such as from the GPS or a cellular network, a PLL 506, a holdover module 508, a statistical module 510, and a control module 512. Clock unit 500 can include additional components not shown in FIG. 5. PLL 506 further includes a phase comparator (PD) 514, a low pass filter (LPF) 516 and a voltage-controlled oscillator (VCO) 518. In this exemplary system, PLL 506 receives both the low-jitter XO clock signal $clk_x$ and the reference input clock $clk_{in}$ and uses these reference clock signals to control the frequency and phase of the internal oscillation signal within PLL 506, and the closed-loop tracking circuit of PLL 506 enables the automatic tracking of the frequency of the input clock $clk_{in}$ by the frequency of the output clock $clk_{out}$.

Note that input clock $clk_x$ from low-jitter XO 502 has a low-jitter. In other words, the signal edge of input clock $clk_x$ has a low deviation relative to the ideal edge position, thereby allowing the clock signal to achieve the desired values of frequency and amplitude. However, the frequency of clock $clk_x$ can change with temperature changes, i.e., having a significant temperature drift characteristic. On the other hand, input clock $clk_T$ from low-cost ordinary TCXO 504 has a low temperature drift characteristic, but includes a more noticeable jitter characteristic.

In some embodiments, holdover module 508 is configured to record the frequency relationship between clock signal $clk_x$ of low jitter XO 502 and reference input clock $clk_{in}$ during the normal (i.e., locked) operation mode of PLL 506 and to control the operation of PLL 506 by providing this recorded relationship to PLL 506 during the holdover operation mode, i.e., when reference input clock $clk_{in}$ is lost, switched, or malfunctions.

In some embodiments, statistical module 510 is configured to compute the frequency relationship between clock signal $clk_x$ output by low-jitter XO 502 and clock signal $clk_T$ output by low-cost ordinary TCXO 504. For example, statistical module 510 can obtain this frequency relationship by using a counter to count the number of rising edges in clock signal $clk_T$ from TXCO 504 between two adjacent rising edges in clock signal $clk_x$ from XO 502. Control module 512 is configured to dynamically adjust the control output of holdover module 508 based on the frequency relationship between the low-jitter input clock $clk_x$ and the low-temperature-drift clock $clk_T$ determined by statistical module 510, in order to compensate for the frequency drift in the low-jitter input clock $clk_x$ caused by the temperature change.

Figure 6:
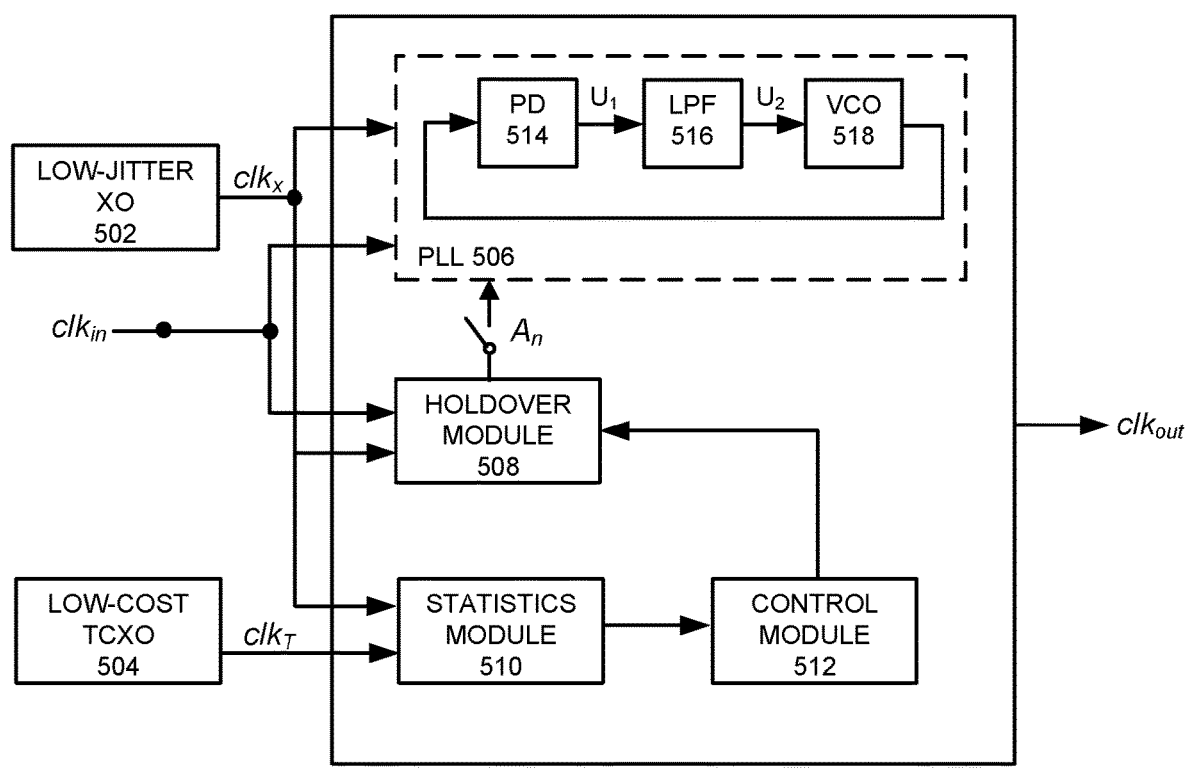
FIG. 6 illustrates a schematic diagram of the low-cost clock unit 500 for generating a low-jitter, low-temperature-drift clock signal during a normal operation mode of the PLL in accordance with some embodiments described herein.

FIG. 6 illustrates a schematic diagram of the low-cost clock unit 500 for generating a low-jitter, low-temperature-drift clock signal during a normal operation mode of the PLL in accordance with some embodiments described herein. In some embodiments, during the normal operation mode, PD 514 is configured to compare the output clock $clk_{out}$ from VCO 518 with applied clock signals (i.e., low-jitter input clock $clk_x$ from XO 502 and the reference input clock $clk_{in}$) to produce an error voltage ($U_1$) corresponding to the phase difference between $clk_{out}$ and the applied clock signals, which is then fed into LPF 516. After filtered by LPF 516, the filtered error voltage ($U_2$) is fed to the control input of VCO 518, which then generates output clock $clk_{out}$ based on the error voltage ($U_2$). In this manner, the frequency differences between $clk_{out}$ and $clk_x$ and between $clk_{out}$ and $clk_{in}$ can be gradually reduced while the phase differences between $clk_{out}$ and $clk_x$ and between $clk_{out}$ and $clk_{in}$ can gradually become constants.

As can be seen in FIG. 6, when the reference input clock $clk_{in}$ is normal (shown as a connected signal path for $clk_{in}$), PLL 506 is in normal locked operation and the frequency relationship between reference input clock $clk_{in}$ and output clock $clk_{out}$ can be expressed as the following:

$$clk_{out}=C \cdot clk_{in} \text{ (C is a constant)}. \qquad \text{Eqn. 1}$$

Moreover, holdover module 508 records the frequency relationship between reference input clock $clk_{in}$ and low-jitter input clock signal $clk_x$ which can be expressed as the following:

$$A_n=clk_{in}/clk_x \ (n=1,2,3,\ldots), \qquad \text{Eqn. 2}$$

wherein $A_n$ can have multitude of different values, such as $A_1$, $A_2$, $A_3$, etc.

Based on Eqn. 1 and Eqn. 2, we can get the relationship between output clock $clk_{out}$ and low-jitter input clock signal $clk_x$ as the following:

$$clk_{out}=C \cdot A_n \cdot clk_x. \qquad \text{Eqn. 3}$$

Note that when reference input clock $clk_{in}$ is lost, Eqn. 3 provides the basis for using holdover module 508 to control PLL 506 to maintain a stable output clock $clk_{out}$. However, when PLL 506 is working normally, holdover module 508 is not required to control PLL 506 (shown as a disconnected signal path between holdover module 508 and PLL 506).

Figure 7:
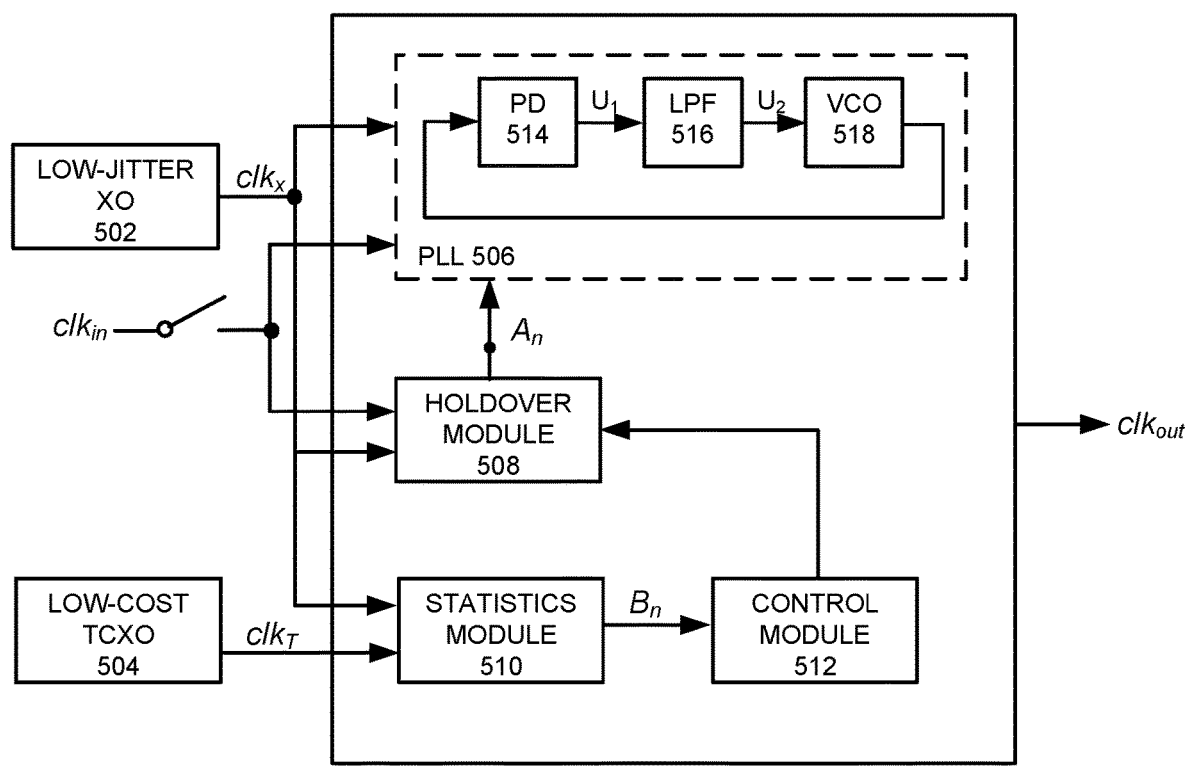
FIG. 7 illustrates a schematic diagram of the low-cost clock unit 500 for generating a low-jitter, low-temperature-drift clock signal during a holdover operation mode of the PLL in accordance with some embodiments described herein.

FIG. 7 illustrates a schematic diagram of the low-cost clock unit 500 for generating a low-jitter, low-temperature-drift clock signal during a holdover operation mode of the PLL in accordance with some embodiments described herein. As can be seen in FIG. 7, during the holdover operation mode, reference input clock $clk_{in}$ is lost (shown as a disconnected signal path of $clk_{in}$) and holdover module 508 begins to control the operation of PLL 506 by providing the recorded relationship between reference input clock $clk_{in}$ and low-jitter input clock signal $clk_x$ (shown as a connected signal path between holdover module 508 and PLL 506). Hence, during this operation mode, the frequency control relationship of Eqn. 3 can be used in place of frequency control relationship of Eqn. 1. In some embodiments, holdover module 508 provides control parameter $A_n$ and low-jitter XO 502 provides low-jitter input clock signal $clk_x$ as the new reference clock for PLL 506.

In some embodiments of the present disclosure, during the holdover operation mode, the control output from holdover module 508 is dynamically adjusted by control module 512 based on the output of statistical module 510. As described above, statistical module 510 is configured to compute the frequency relationship between low-jitter input clock $clk_x$ and low-temperature-drift clock $clk_T$ output by low-cost ordinary TCXO 504. Hence, clock $clk_x$ in Eqn. 3 can be adjusted by the statistic relationship between clock $clk_x$ and clock $clk_T$ determined by statistical module 510. This dynamic adjustment of holdover module 508 control output can be used to compensate for the frequency drift in the low-jitter input clock $clk_x$ caused by the temperature changes.

In some embodiments, statistical module 510 determines the frequency relationship between the low-jitter input clock $clk_x$ and low-temperature-drift input clock $clk_T$ by using the following relationship:

$$B_n=clk_x/clk_T \ (n=1,2,3,\ldots), \qquad \text{Eqn. 4}$$

wherein $B_n$ can have multitude of different values which change with time, such as $B_1$, $B_2$, $B_3$, etc. Statistical module 510 subsequently outputs $B_n$ to control module 512.

From Eqn. 4 it can be observed that when the temperature changes causing low-jitter XO clock frequency to change, statistical module 510 output value $B_n$ will change. This change subsequently causes control module 512 to change holdover module 508 output value $A_n$. For example, when $B_{n+1}>B_n$ (wherein $B_{n+1}$ is measured at a later time after $B_n$), this suggests that the low-jitter input clock $clk_x$ frequency of low-jitter XO 502 has increased. If no adjustment is made to $clk_x$, output clock $clk_{out}$ of clock unit 500 will also increase according to Eqn. 3. In this scenario, embodiments of the present technique use control module 512 to make a corresponding change to holdover module 508 output $A_n$ by replacing the output value $A_n$ with a correspondingly smaller output value $A_{n+1}<A_n$ (wherein $A_{n+1}$ is output at a later time after $A_n$), thereby compensating for the temperature drift in the low-jitter XO output clock $clk_x$.

Alternatively, when $B_{n+1}<B_n$ (wherein $B_{n+1}$ is measured at a later time after $B_n$), this suggests that the low-jitter input clock $clk_x$ frequency of low-jitter XO 502 has decreased. If no adjustment is made to $clk_x$, output clock $clk_{out}$ of clock unit 500 will also decrease according to Eqn. 3. In this scenario, embodiments of the present technique use control module 512 to make a corresponding change to holdover module 508 output $A_n$ by replacing the output value $A_n$ with a correspondingly larger output value $A_{n+1} > A_n$ (wherein $A_{n+1}$ is output at a later time after $A_n$), thereby compensating for the temperature drift in the low-jitter XO output clock $clk_x$.

Hence, the present technique can be used to compensate for the undesirable characteristic of low-jitter XO 502 clock frequency changing as the temperature changes, so that the temperature stability of the output clock $clk_{out}$ is maintained at different temperature conditions. As a result, the output clock $clk_{out}$ of clock unit 500 can be brought into an equilibrium state according to Eqn. 3. Thus, even when the reference input clock $clk_{in}$ is lost, the present technique under the holdover operation mode can achieve a locked state of the output clock $clk_{out}$ and thus PLL 506.

Note that, in the present technique under the holdover operation mode, because PLL 506 uses low-jitter XO output $clk_x$ as the main reference clock, the relatively poor jitter performance of the low-cost TCXO 504 is not reflected in the output clock $clk_{out}$. Hence, the present technique also ensures that the jitter performance of the output clock $clk_{out}$ is not affected by the jitter performance of the low-cost TCXO 504.

Hence, in various embodiments described above, the disclosed clock unit uses both a low-cost low-jitter XO and a low-cost ordinary TCXO to provide frequency references during the holdover operation mode to ensure low cost of the entire clock unit, and at the same time generating an output clock signal having both low-jitter and low-temperature-drift characteristics. In some embodiments, the low-jitter XO 502 can be replaced by a crystal as the main body in conjunction with a low-jitter oscillation circuit. Therefore, the proposal clock unit is not limited to using a low-jitter XO to provide the low-jitter clock source, and the structure of the clock unit 500 is not limited to the particular structure shown in FIGS. 5-7. Moreover, the implementation of statistical module 510 is not limited to the counting technique described above.

In conclusion, the above-described clock unit and generation technique is based on using three input clock signals: the low-cost TCXO input clock signal $clk_T$, the low-jitter XO input clock signal $clk_x$, and the reference input clock signal $clk_{in}$, all of which can be input to the clock unit at the same time. During the holdover operation mode, that is, when the reference clock signal $clk_{in}$ is lost, a control module is configured to perform a logic control function based on the frequency relationship between the low-jitter XO clock $clk_x$ and the low-temperature-drift TCXO clock $clk_T$ determined by a statistical module, which includes dynamically adjusting the control output of a holdover module, thereby ensuring both the frequency and phase stabilities of the output clock signal $clk_{out}$ during the holdover operation mode are maintained, so that the output clock signal $clk_{out}$ has both low-jitter and low-temperature-drift characteristics, while meeting the low-cost requirement for the clock unit.

This patent disclosure additionally provides another embodiment of the clock unit based on modifying the embodiments described in conjunction with FIGS. 5-7. In this embodiment, a thermal sensor and an analog-to-digital converter (ADC) module are used to allow monitoring temperature changes; and a control module is configured to dynamically adjust the output of the holdover module based on a determined relationship between the low-jitter XO frequency variation and the temperature change. More specifically, when the reference input clock $clk_{in}$ is normal, the holdover module records the state of the reference input clock; the thermal sensor and the ADC module record the temperature changes in the clock unit; and the PLL is in normal locked operation whereby the output clock signal reaches frequency and phase synchronization, so that the output of the clock signal with low temperature drift, low jitter characteristics.

When the reference input clock is switched, lost, or malfunctions, the clock unit enters the holdover operation mode. Under this operation mode, the holdover module is configured to output the recorded state of the reference input clock. The control module is configured to dynamically adjust the output of the holdover module based on a known relationship between the frequency change of the low-jitter input clock and the temperature change and the recorded temperature changes by the thermal sensor and the ADC module, so as to compensate for the frequency drifts in the low-jitter clock source from the low-jitter XO caused by the temperature changes, thereby ensuring low temperature drift in the output clock during the holdover operation mode. Moreover, during the holdover operation mode, the PLL loop remains closed and the low-jitter clock source from the low-jitter XO is used as the main reference clock source for the PLL. In this manner, the proposed clock unit also ensures low jitter characteristic of the output clock. Furthermore, because the low-jitter XO is a low-cost device, while both the thermal sensor and the ADC module can be implemented inside a chip, the proposed system and technique also ensures low cost of the entire clock unit.

Figure 8:
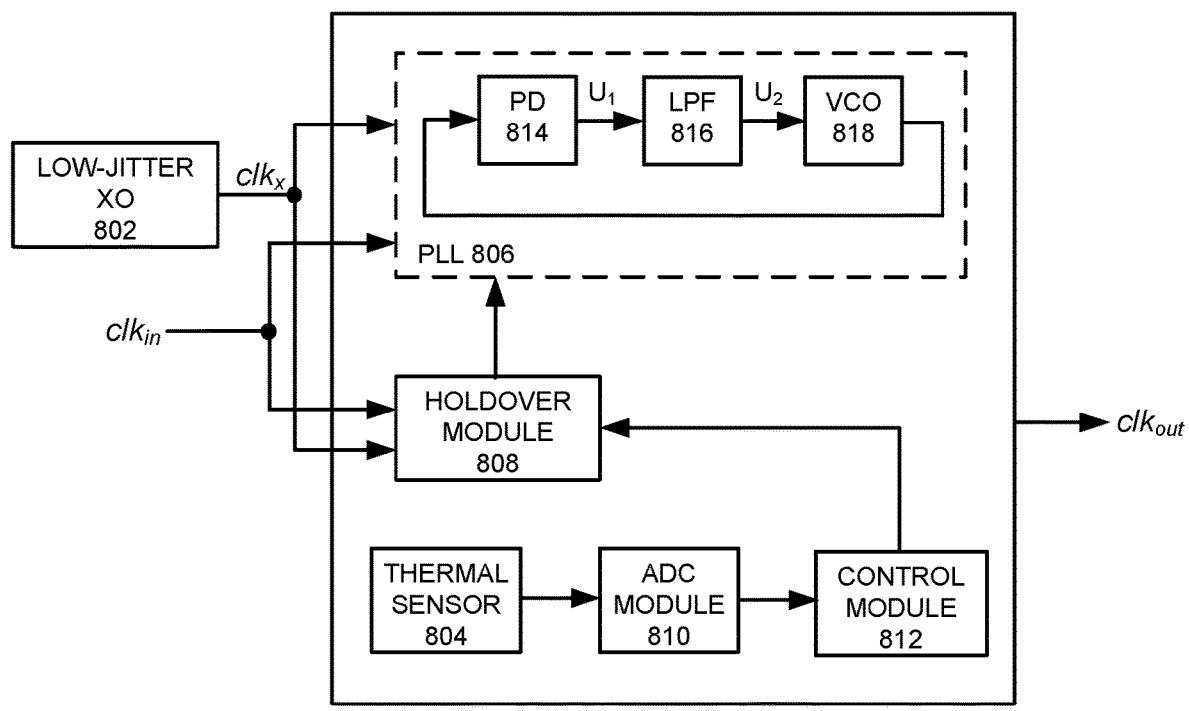
FIG. 8 illustrates a schematic diagram of an exemplary low-cost clock unit for generating a low-jitter, low-temperature-drift clock signal in accordance with other embodiments described herein.

FIG. 8 illustrates a schematic diagram of an exemplary low-cost clock unit 800 for generating a low-jitter, low-temperature-drift clock signal in accordance with some embodiments described herein. As can be seen in FIG. 8, clock unit 800 includes a low-jitter XO 802 for generating a low-jitter input clock $clk_x$, a reference input clock $clk_{in}$ from an external clock source, such as from the GPS or a cellular network, a PLL 806, a holdover module 808, a control module 812, a thermal sensor 804, and an ADC module 810. Clock unit 800 can include additional components not shown in FIG. 8. PLL 806 further includes a PD 814, a LPF 816 and a VCO 818.

In some embodiments, holdover module 808 is configured to record the frequency relationship between clock signal $clk_x$ output by low jitter XO 802 and reference input clock $clk_{in}$ during the normal (i.e., locked) operation mode of PLL 806 and to control the operation of PLL 806 by providing this recorded relationship to PLL 806 during the holdover operation mode, i.e., when reference input clock $clk_{in}$ is lost, switched, or malfunctions. In some embodiments, control module 812 is configured to dynamically adjust the control output of holdover module 808 based on the measured temperature changes by thermal sensor 804 and ADC module 810 and a known relationship between the frequency change of the low-jitter input clock $clk_x$ and the temperature change in order to compensate for the frequency drift in the low-jitter input clock $clk_x$ caused by the temperature changes.

Figure 9:
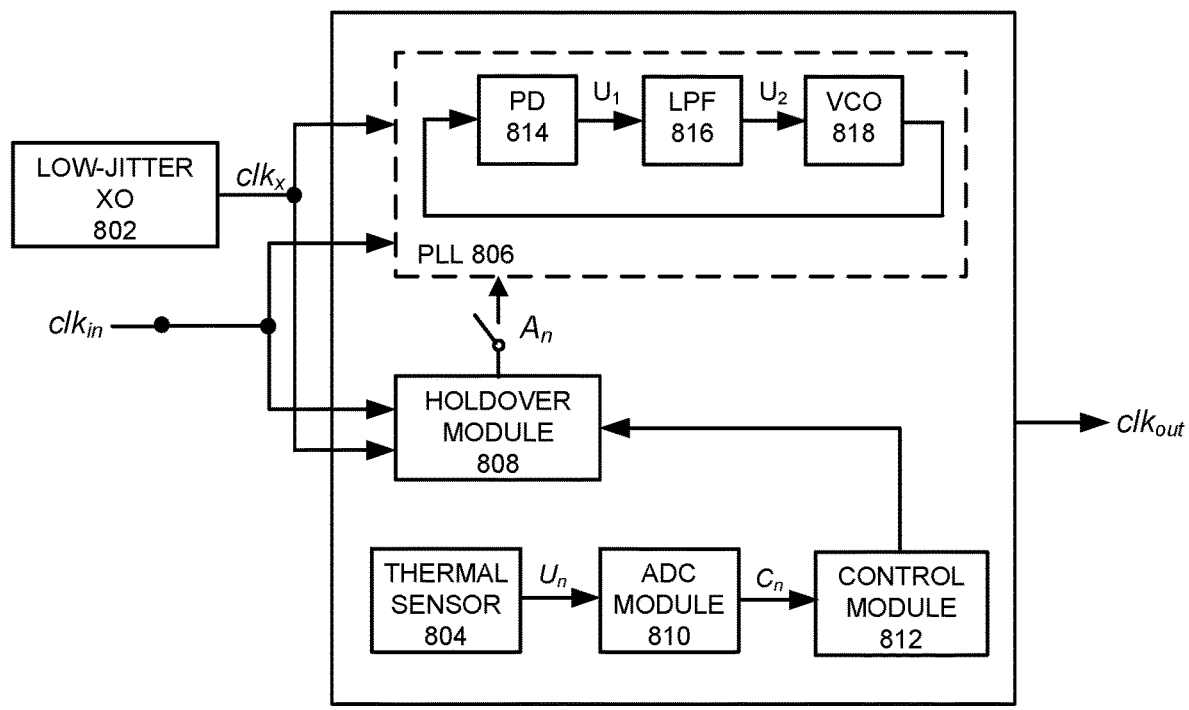
FIG. 9 illustrates a schematic diagram of the low-cost clock unit 800 for generating a low-jitter, low-temperature-drift clock signal during a normal operation mode of the PLL in accordance with other embodiments described herein.

FIG. 9 illustrates a schematic diagram of the low-cost clock unit 800 for generating a low-jitter, low-temperature-drift clock signal during a normal operation mode of the PLL in accordance with some embodiments described herein. During the normal operation mode, the operation of PLL 806 can be substantially the same as the normal operation of PLL 506 described above.

As can be seen in FIG. 9, when the reference input clock $clk_{in}$ is normal (shown as a connected signal path for $clk_{in}$), PLL 806 is in normal locked operation and the frequency relationship between reference input clock $clk_{in}$ and output clock $clk_{out}$ can be expressed as the following:

$$clk_{out} = C \cdot clk_{in} \text{ (C is a constant).} \qquad \text{Eqn. 1}$$

Moreover, holdover module 808 records the frequency relationship between reference input clock $clk_{in}$ and low-jitter input clock signal $clk_x$ which can be expressed as the following:

$$A_n = clk_{in}/clk_x \ (n=1,2,3,\ldots), \qquad \text{Eqn. 2}$$

wherein $A_n$ can have multitude of different values which can vary with time, such as $A_1$, $A_2$, $A_3$, etc.

Based on Eqn. 1 and Eqn. 2, we can get the relationship between output clock $clk_{out}$ and low-jitter input clock signal $clk_x$ as the following:

$$clk_{out} = C \cdot A_n \cdot clk_x. \qquad \text{Eqn. 3}$$

Note that when reference input clock $clk_{in}$ is lost, Eqn. 3 provides the basis for using holdover module 808 to control PLL 806 to maintain a stable output clock $clk_{out}$. However, when PLL 806 is working normally, holdover module 808 is not required to control PLL 806 (shown as a disconnected signal path between holdover module 808 and PLL 806).

Figure 10:
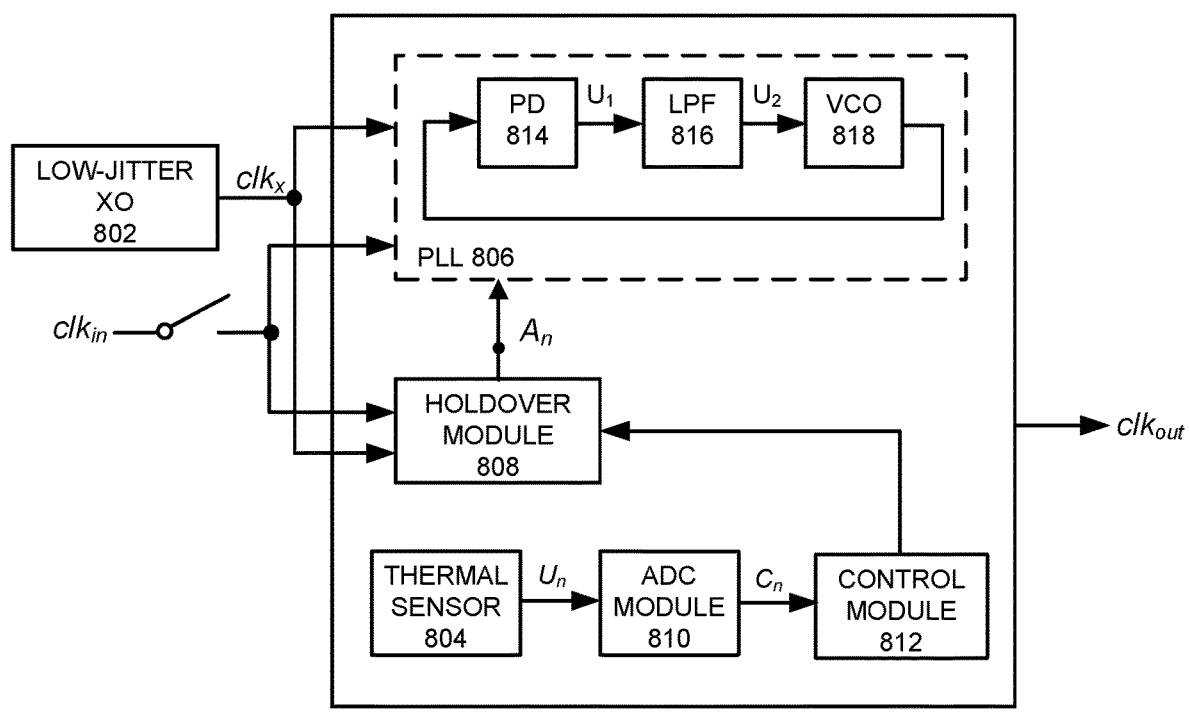
FIG. 10 illustrates a schematic diagram of the low-cost clock unit 800 for generating a low-jitter, low-temperature-drift clock signal during a holdover operation mode of the PLL in accordance with other embodiments described herein.

FIG. 10 illustrates a schematic diagram of the low-cost clock unit 800 for generating a low-jitter, low-temperature-drift clock signal during a holdover operation mode of the PLL in accordance with some embodiments described herein. As can be seen in FIG. 10, during the holdover operation mode, reference input clock $clk_{in}$ is lost (shown as a disconnected signal path of $clk_{in}$) and holdover module 808 begins to control the operation of PLL 806 by providing the recorded relationship between reference input clock $clk_{in}$ and low-jitter input clock signal $clk_x$ (shown as a connected signal path between holdover module 808 and PLL 806). Moreover, because the pattern of frequency change of the low-jitter XO clock $clk_x$ as a result of the temperature change is known, when the reference input clock $clk_{in}$ is lost, the frequency control relationship of Eqn. 3 can be used in place of frequency control relationship of Eqn. 1. In some embodiments, holdover module 808 provides control parameter $A_n$ which is dynamically adjusted by control module 812 based on the output Cu of ADC module 810.

More specifically, the voltage values $U_n$ (n=1, 2, 3 . . . ) generated by thermal sensor 804 vary with the temperature and time. The different voltage values $U_n$ are processed by ADC module 810 to form the corresponding digital signals $C_n$ (n=1, 2, 3 . . . ), so that $C_n$ can be used to represent the temperature changes. The temperature change signal Cu (n=1, 2, 3 . . . ) is fed to control module 812, which is configured to dynamically adjust the control value $A_n$ based on the known frequency change relationship between the low-jitter XO clock $clk_x$ and the temperature.

For example, based on the known frequency change relationship between the low-jitter XO clock $clk_x$ and the temperature, when the measured temperature is $C_1$, the frequency drift of the low-jitter XO clock $clk_x$ can be clearly determined. Hence, control module 812 can dynamically adjust the control value $A_n$ to maintain a stable output clock $clk_{out}$ under any given temperature. Consequently, the embodiment described in conjunction with FIGS. 8-10 can be used to compensate for the undesirable characteristic of low-jitter XO 802 clock frequency changing with the temperature change, so that the temperature stability of the output clock $clk_{out}$ is maintained at different temperature conditions. As a result, the output clock $clk_{out}$ of clock unit 800 can be brought into an equilibrium state according to Eqn. 3 under the holdover operation mode. Thus, even when the reference input clock $clk_{in}$ is lost, the described embodiment under the holdover operation mode can achieve a locked state of the output clock $clk_{out}$ and thus PLL 806.

Hence, the same technical effect and result achieved by the embodiments described in conjunction with FIGS. 5-7 can also be achieved by the embodiments described in conjunction with FIGS. 8-10.

In conclusion, the above-described clock unit and generation technique is based on using two input clock signals: the low-jitter XO input clock signal $clk_x$ and the reference input clock signal $clk_{in}$, all of which are input to the clock unit at the same time. During the holdover operation mode, that is, when the reference clock signal $clk_{in}$ is lost, a control module is configured to dynamically adjusting the control output of a holdover module based on the temperature changes collected by a thermal sensor and an ADC module, thereby ensuring both the frequency and phase stabilities of the output clock signal $clk_{out}$ during the holdover operation mode are maintained, so that the output clock signal $clk_{out}$ has both low-jitter and low-temperature-drift characteristics, while meeting the low-cost requirement for the clock unit.

Note that for both the three-input-clock-based embodiments in conjunction with FIGS. 5-7 and the two-input-clock-based embodiments in conjunction with FIGS. 8-10, during the holdover operation mode, the corresponding control module is configured to dynamically adjust the output of the holdover module according to a determined relationship between the low jitter XO frequency variation and the temperature change. For the three-input-clock-based embodiment, this relationship is determined by the statistical module, whereas for the two-input-clock-based embodiment, this relationship is determined by the thermal sensor and the ADC. Both embodiments ensure that both the frequency and phase stabilities of the output clock signal $clk_{out}$ during the holdover operation mode are maintained, so that the output clock signal $clk_{out}$ has both low-jitter and low-temperature-drift characteristics, while meeting the low-cost requirement of the clock unit.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product While this patent document contains many specifics, these should not be construed as limitations on the scope of any invention or of what may be claimed, but rather as descriptions of features that may be specific to particular embodiments of particular inventions. Certain features that are described in this patent document and attached appendix in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendix should not be understood as requiring such separation in all embodiments.

Only a few implementations and examples are described and other implementations, enhancements and variations can be made based on what is described and illustrated in this patent document.

What is claimed is:

1. A phase-locked loop (PLL)-based clock generation module, comprising:

a PLL configured to receive a reference input clock, to generate an output clock based on the reference input clock during a first operation mode, and to receive a low-jitter input clock during the first operation mode;

a holdover module coupled to the PLL and configured to:
receive the low-jitter input clock and the reference input clock;
record a first relationship between the frequency of the low-jitter input clock and the frequency of the reference input clock during the first operation mode; and
output the recorded first relationship to the PLL as a control signal to control the operation of the PLL during a second operation mode when the reference input clock is not available;

a control module coupled to the holdover module and configured to:
receive a second relationship between a frequency change of the low-jitter input clock and a temperature change; and
dynamically adjust the output of the holdover module during the second operation mode based on the second relationship to compensate for a frequency drift in the low-jitter input clock caused by the temperature change;

wherein during the second operation mode, the PLL is further configured to:
receive the low-jitter input clock;
receive the control signal from the holdover module, wherein the control signal includes the recorded first relationship dynamically adjusted based on the second relationship; and
generate an output clock based on the low-jitter input clock and the control signal, wherein the output clock has both low-jitter and low-temperature-drift characteristics.

2. The clock generation module of claim 1, further comprising a low-jitter clock source, wherein the low-jitter clock source is coupled to an input of the PLL and configured to generate the low-jitter input clock, and wherein the low-jitter clock source includes a low-jitter crystal oscillator (XO) or a crystal as the main body and a low-jitter oscillation circuit coupled to the crystal.

3. The clock generation module of claim 1, wherein the low jitter input clock is received from an external clock source.

4. The clock generation module of claim 1, wherein the reference input clock is received from an external clock source.

5. The clock generation module of claim 1, wherein the first relationship includes a first ratio of the reference input clock to the low-jitter input clock, wherein the first ratio is a time-variant function.

6. The clock generation module of claim 1, wherein the holdover module is further configured to store the first relationship during the first operation mode.

7. The clock generation module of claim 1, wherein the clock generation module is switched from the first operation mode to the second operation mode when the reference input clock is switched from one external clock source to another external clock source, is lost or malfunctions.

8. The clock generation module of claim 1, further comprising a low-cost temperature-compensate crystal oscillator (TCXO) configured to generate a low-temperature-drift input clock.

9. The clock generation module of claim 8, further comprising a statistical module coupled to the control module, wherein the statistical module is configured to:
- receive the low-jitter input clock from the low-jitter clock source and the low-temperature-drift input clock from the low-cost TCXO;
- compute the second relationship based on the low-jitter input clock and the low-temperature-drift input clock; and
- provide the computed second relationship to the control module.

10. The clock generation module of claim 9, wherein the second relationship includes a second ratio of the low-jitter input clock to the low-temperature-drift input clock, wherein the second ratio is a time-variant function.

11. The clock generation module of claim 10, wherein the control module is configured to dynamically adjust the output of the holdover module during the second operation mode based on the second relationship by:
- determining if the second ratio increases in value from the previous sampling time; and
- if so, dynamically adjusting the output of the holdover module by decreasing the output value to offset the increase in value of the second ratio, thereby compensating for an upward frequency drift of the low-jitter input clock as a result of the temperature change.

12. The clock generation module of claim 10, wherein the control module is configured to dynamically adjust the output of the holdover module during the second operation mode based on the second relationship by:
- determining if the second ratio decreases in value from the previous sampling time; and
- if so, dynamically adjusting the output of the holdover module by increasing the output value to offset the decrease in value of the second ratio, thereby compensating for a downward frequency drift of the low-jitter input clock as a result of the temperature change.

13. The clock generation module of claim 1, wherein the output clock and the PLL are in a phase and frequency locked operation during the second operation mode even without the reference input clock.

14. The clock generation module of claim 8, wherein both the low-jitter XO and the low-cost TCXO are low-cost devices, thereby ensuring that the output clock has both low-jitter and low-temperature-drift characteristics while the clock generation module still has a low overall system cost.

15. The clock generation module of claim 1, further comprising a thermal sensor and an analog-to-digital converter (ADC) coupled to output of the thermal sensor, wherein the thermal sensor and the ADC are configured to measure a temperature change at a given time during the second operation mode.

16. The clock generation module of claim 15, wherein the second relationship includes a known relationship between the frequency change of the low-jitter input clock and the temperature change, and wherein the control module is configured to dynamically adjust the output of the holdover module during the second operation mode based on the second relationship by:
- receiving the known relationship between the frequency change of the low-jitter input clock and the temperature change;
- receiving the measured temperature change at the given time;
- determining an amount of frequency drift of the low-jitter input clock at the given time based on the known relationship and the measured temperature change at the given time; and
- dynamically adjusting the output of the holdover module to compensate for the amount of frequency drift of the low-jitter input clock determined at the given time, thereby maintaining a low-jitter and low-temperature-drift output clock.

17. The clock generation module of claim 15, wherein the low-jitter XO is a low-cost device, and both the thermal sensor and the ADC are implemented inside a chip, thereby ensuring that the output clock has both low-jitter and low-temperature-drift characteristics while the clock generation module still has a low overall system cost.

18. A phase-locked loop (PLL) module which is configured to receive a reference input clock and generate an output clock based on the reference input clock during a first operation mode, the PLL module comprising:
- a phase comparator (PD), a low pass filter (LPF), and a voltage-controlled oscillator (VCO) coupled together in a loop circuit;
- a holdover module coupled to the loop circuit and configured to:
  - receive a low-jitter input clock from a low-jitter clock source and the reference input clock;
  - record a first relationship between the frequency of the low-jitter input clock and the frequency of the reference input clock during the first operation mode; and
  - output the recorded first relationship to the loop circuit as a control signal to control the operation of the loop circuit during a second operation mode when the reference input clock is not available;
- a control module coupled to the holdover module and configured to:
  - receive a second relationship between a frequency change of the low-jitter input clock and a temperature change; and
  - dynamically adjust the output of the holdover module during the second operation mode based on the second relationship to compensate for a frequency drift in the low-jitter input clock caused by the temperature change;
- wherein during the second operation mode, the loop circuit is further configured to:
  - receive the low-jitter input clock;
  - receive the control signal from the holdover module, wherein the control signal includes the recorded first relationship dynamically adjusted based on the second relationship; and
  - generate an output clock based on the low-jitter input clock and the control signal, wherein the output clock has both low-jitter and low-temperature-drift characteristics.

19. The PLL module of claim 18, further comprising a statistical module coupled to the control module, wherein the statistical module is configured to:
- receive the low-jitter input clock from the low-jitter clock source;
- receive a low-temperature-drift input clock from the low-cost TCXO;
- compute the second relationship based on the low-jitter input clock and the low-temperature-drift input clock; and
- provide the computed second relationship to the control module.

20. A method for performing a holdover function within a clock module based on a phase-locked loop (PLL), the method comprising:
- receiving a low-jitter input clock from a low-jitter clock source;
- receiving a reference input clock from an external clock source;
- recording a first relationship between the frequency of the low-jitter input clock and the frequency of the reference input clock during a first operation mode of the PLL when the reference input clock is available;
- determining a second relationship between a frequency change of the low-jitter input clock and a temperature change;
- outputting the recorded first relationship as a control signal to control the operation of the PLL during a second operation mode of the PLL when the reference input clock is not available, wherein the second operation mode of the PLL includes generating an output clock based on the low-jitter input clock and the control signal; and
- wherein while controlling the operation of the PLL based on the recorded first relationship, dynamically adjusting the recorded first relationship based on the second relationship to compensate for a frequency drift in the low-jitter input clock caused by the temperature change so that the output clock has both low-jitter and low-temperature-drift characteristics.

* * * * *